United States Patent [19]

Okino

[11] Patent Number: 4,984,015
[45] Date of Patent: Jan. 8, 1991

[54] EXPOSURE METHOD AND APPARATUS

[75] Inventor: Yoshiharu Okino, Minami-ashigara, Japan

[73] Assignee: Fuji Photo Film Co., Ltd., Kanagawa, Japan

[21] Appl. No.: 324,782

[22] Filed: Mar. 17, 1989

[30] Foreign Application Priority Data

Mar. 17, 1988 [JP] Japan .................................. 63-64100

[51] Int. Cl.$^5$ ............................................ G03B 27/72
[52] U.S. Cl. .......................................... 355/68; 355/69
[58] Field of Search .............................. 355/68, 69, 38; 315/241 P

[56] References Cited

U.S. PATENT DOCUMENTS 4,551,011 11/1985 Yuasa et al. ..................... 355/69 X Primary Examiner—L. T. Hix
Assistant Examiner—D. Rutledge
Attorney, Agent, or Firm—Sughrue, Mion, Zinn, Macpeak & Seas

[57] ABSTRACT

A photosensitive material is exposed to light from a light source in an exposure corresponding to the image density of each picture element by selecting a plurality of light output modulation steps from the light output of the light source, selecting a plurality of exposure time modulation steps, computing the exposure as sets of a light output modulation step and an exposure time modulation step, selecting from them a set corresponding to the maximum exposure time modulation step as exposure parameters, and exposing the photosensitive material in accordance with the selected exposure parameters. An exposure apparatus for carrying out such optimum exposure include a light source, a light detector, an exposure parameter computing unit, and a driver for the light source.

16 Claims, 6 Drawing Sheets

EXPOSURE METHOD AND APPARATUS

FIELD OF THE INVENTION

This invention relates to a method and apparatus for performing exposure to a proper level of light for a proper time using a control for correcting a variation with temperature of a light output of a light source.

BACKGROUND OF THE INVENTION

Conventional image recording apparatus used in general printing, photographic printing, and copying arts use light-emitting elements including laser diodes (LD) and light-emitting diodes (LED).

A color image is generally produced by using three chrominance signals of R, G and B, controlledly turning on light sources in correspondence with the chrominance signals to produce a light output, and scanning a color photosensitive material with the light output, followed by development and fixing. A monochromatic image can be similarly produced except that luminance signals and a monochromatic photosensitive material are used. To obtain images of high quality, it is desirable to optimize the exposure or exposure energy to the photosensitive material for each picture element.

One system contemplated for controlling an exposure per picture element, which relies on analog processing, is by amplifying each chrominance signal (a luminance signal for a monochromatic image) to modulate a light output of a light source. FIG. 6 is a diagram illustrating the light output (P) of a light-emitting element as a function of driving electric current (I). FIG. 7 is a diagram illustrating the image density (D) of a photosensitive material as a function of exposure energy (E). As seen from FIG. 6, the light-emitting element has a non-linear input-to-output (current-to-light output) relationship. As seen from FIG. 7, the photosensitive material also has a non-linear input-to-output (exposure-to-image density) relationship. Therefore, analog processing is unsuitable to produce images of high quality because of complexity and difficulty to effect correction between each chrominance signal and the photosensitive material image density.

Also contemplated is a digital processing system comprising sampling each chrominance signal for every picture element to convert it into a digital signal, and turning on a light source in response to the digital signal value, achieving pulsed exposure. This system includes a time interval modulation or pulse width modulation (PWM) mode in which continuous exposure is carried out for only a time corresponding to the digital signal value for every picture element, with the light output set fixed; an intensity modulation or pulse amplitude modulation (PAM) mode in which exposure is carried out with a light output corresponding to the digital signal value for every picture element, with the exposure time set fixed; and an exposure number modulation or pulse number modulation (PNM) mode in which exposure is carried out a number of times corresponding to the digital signal value for every picture element, with the light output and the single exposure time set fixed.

However, since light-emitting elements such as LD and LED largely vary their light output level with a change of temperature as shown in FIG. 6, control is usually carried out to compensate for such a variation. One conventional light output correction technique uses an automatic power control (APC) circuit.

The control method relying on the APC circuit maintains a certain selected light output level irrespective of temperature changes. Then, proper correction is not carried out at all levels of light output in the case of a light-emitting element having an essentially nonlinear input vs. output characteristic. In any exposure systems of the intensity, time interval and exposure number modulation modes, there would be left levels which are not corrected to a proper light output. This results in over- or under-exposure at corresponding areas, causing unevenness of exposure.

Where a laser diode is used as the light source, it changes its light emitting mode between laser oscillation and LED light emission in proximity to the threshold current, that is, changes its optical nature. Because of this nature and the previously mentioned variation of the output-to-input characteristic with temperature, modulation of the intensity at this light output level will result in an unstable light output, particularly in the case of PAM.

The photosensitive material has the nature that the difference between exposures (exposure energies) relative to a density difference is smaller in a moderate density zone as shown in FIG. 7. Thus, the time interval modulation mode as typified by PWM and the exposure number modulation mode as typified by PNM require a clock of a higher frequency as the number of gradations to be adjusted increases.

FIG. 8 is a diagram showing the effective sensitivity of a photosensitive material as a function of exposure time. It is seen from FIG. 8 that the effective sensitivity is lowered by reciprocity law failure when the exposure time is short. Differently stated, even when the exposure or exposure energy is kept constant, low intensity exposure or extremely high intensity short time exposure does not meet the reciprocity law that the optical density of an image is proportional to the exposure, that is, the product of light output and exposure time. In either case, reciprocity law failure occurs, failing to achieve a correct image density.

The intensity modulation or PAM and time interval modulation or PWM modes are affected by the reciprocity law failure at low or high light output levels. It is particularly true at low light output levels because the exposure time is short.

SUMMARY OF THE INVENTION

A primary object of the present invention is to provide an improved exposure method and apparatus capable of stable exposure control in a low exposure region, exposure control in an intermediate density region with a relatively simple circuit, and minimizing a lowering of sensitivity by reciprocity law failure.

According to one aspect of the present invention, there is provided a method for exposing a photosensitive material to light from a light source in an exposure (or amount of light) corresponding to the image density of each picture element, comprising the steps of:

determining the exposure as sets of a plurality of light output modulation steps selected from the light output of the light source under predetermined conditions and a plurality of exposure time modulation steps, selecting a set corresponding to the maximum exposure time modulation step among the sets as exposure parameters, and exposing the photosensitive material in accordance with the exposure parameters.

According to another aspect of the present invention, there is provided an apparatus for exposing for image recording a photosensitive material to light in an exposure (or amount of light) corresponding to the image density of each picture element, comprising a light source for producing a light output, an optical detector for detecting the light output of the light source, exposure parameter providing means for, prior to exposure of the photosensitive material to light from the light source, determining the exposure as sets of a plurality of light output modulation steps selected from the detected light output under predetermined conditions and a plurality of exposure time modulation steps, and selecting a set corresponding to the maximum exposure time modulation step among the sets as exposure parameters, and means for actuating the light source in accordance with the selected exposure parameters.

BRIEF DESCRIPTION OF THE DRAWINGS

The above and other objects, features, and advantages of the present invention will be better understood from the following description taken in conjunction with the accompanying drawings, in which.

DETAILED DESCRIPTION OF THE INVENTION

The light source used in the practice of the present invention may be selected from any desired conventional light sources as long as it can be used to expose a photosensitive material to light in response to a digital chrominance signal or digital luminance signal. Such light sources include laser light sources such as laser diodes (LD), gas laser, and solid laser, and light-emitting elements such as light-emitting diodes (LED), with the laser diode being preferred.

Figure 1:
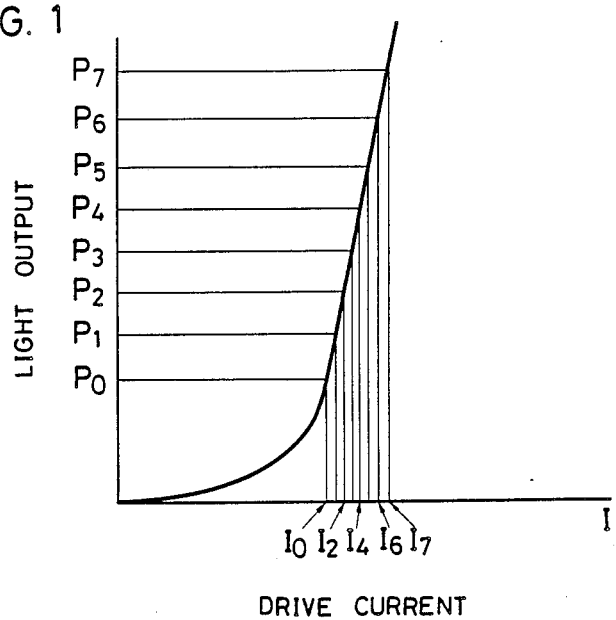
FIG. 1 is a diagram illustrating light output modulation steps of a light source and corresponding drive current steps as used in the exposure method and apparatus of the present invention.

A laser diode (LD) produces a light output as shown in FIG. 1 as a function of driving electric current. On the other hand, a photosensitive material produces a nonlinear image density in response to an exposure or exposure energy. For example, a positive photosensitive material has an image density curve as shown in FIG. 2 as a function of exposure.

Figure 2:
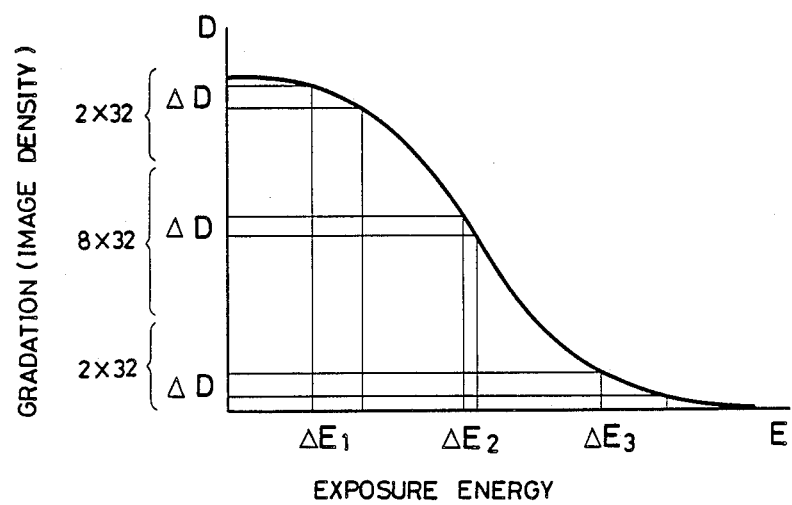
FIG. 2 is a diagram illustrating exposure steps for a photosensitive material and corresponding steps of image gradation or density as used in the exposure method and apparatus of the present invention.

The exposure method of the present invention is now described by referring to a typical embodiment in which a photosensitive material having an optical density characteristic as shown in FIG. 2 is exposed to light from an LD light source having a light output characteristic as shown in FIG. 1.

According to the present invention, the light output of the light source is divided into a plurality of light output modulation steps in the most stable region, for example, a region where the light output vs. current curve is most linear above the threshold current, where the photosensitive material is not affected by reciprocity law failure, and where a necessary exposure is available. In the embodiment illustrated in FIG. 1, the light output is divided into eight (8) light output modulation steps $P_0$ through $P_7$.

The exposure (amount of light) or exposure energy E is given as the product of light output (P) and exposure time (t), that is, $E = P \times t$. A plurality of time modulation steps are selected as exposure time intervals in accordance with said plurality of light output modulation steps. In this embodiment, thirty two (32) time modulation steps $t_0$ through $t_{31}$ are selected.

Exposure time modulation steps $t_0$ through $t_{31}$ may be recording times of equal intervals. But, to fully correct a lowering in effective sensitivity by reciprocity law failure, the steps are preferably time settings empirically determined to "provide an essentially equivalent exposure effect to equal intervals."

Figure 3:
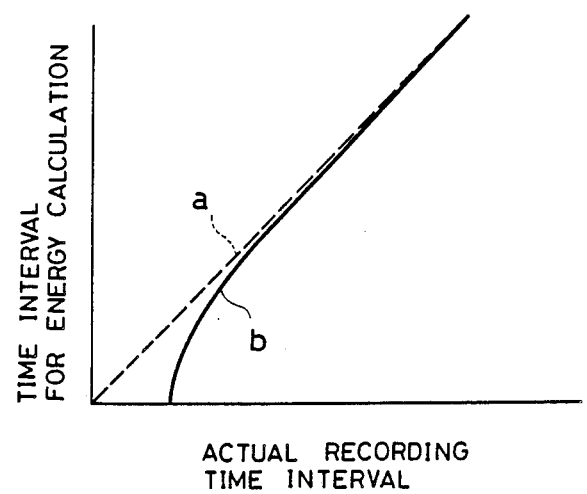
FIG. 3 is a diagram illustrating an exposure time interval actually recorded for the correction of a lowering of effective sensitivity by reciprocity law failure and exposure time modulation steps used in exposure calculation.

As shown in FIG. 3, for example, the time interval is given by a straight line a having a gradient of 45° in the absence of reciprocity law failure, but a curve b when corrected for reciprocity law failure. Curve b may be empirically determined. It is, of course, recommended that exposure time modulation steps $t_0$ through $t_{31}$ are used for the calculation of an exposure, and the pulse width or time interval upon actual recording is determined in accordance with curve b.

Also, a plurality of image density steps are selected in order to achieve a high image gradation. In the embodiment illustrated in FIG. 2, sixty four (64) image density steps $D_0$ through $D_{63}$ are selected. These 64 image density steps can be optimum sets selected from the sets of 8 light output modulation steps and 32 exposure time modulation steps.

According to the present invention, a choice is made as follows. In a region of a high image density, that is, in a region of a reduced exposure E, two steps $P_0$ and $P_1$ as shown in FIG. 1 are used as the light output and all 32 steps are used as the exposure time. A proper set is selected among 64 (2×32) sets as shown in FIG. 2 to afford a necessary exposure to provide a predetermined density.

In a region of a moderate image density, that is, in a region of a moderate exposure E, all 8 steps $P_0$ through $P_7$ as shown in FIG. 1 are used as the light output and all 32 steps are used as the exposure time. A proper set is selected among 256 (8×32) sets as shown in FIG. 2 to afford a necessary exposure to provide a predetermined density.

In a region of a low image density, that is, in a region of an increased exposure E, two steps $P_6$ and $P_7$ as shown in FIG. 1 are used as the light output and all 32 steps are used as the exposure time. A proper set is selected among 64 (2×32) sets as shown in FIG. 2 to afford a necessary exposure to provide a predetermined density.

To select a set capable of affording the predetermined (necessary) exposure among sets of light output modulation steps and exposure time modulation steps means to select a set whose exposure error falls within a predetermined permissible range.

The thus selected set of a light output modulation step and an exposure time modulation step ensure an exposure whose error relative to the predetermined exposure falls within the permissible error range, and provides exposure parameters. If two or more sets are available, one set corresponding to the maximum exposure time modulation step is selected as exposure parameters. If no set is available, a set capable of affording an exposure closest to the predetermined exposure is selected as exposure parameters. Consequently, a lowering of sensitivity by reciprocity law failure can be minimized in regions of low or high light output.

In accordance with the thus selected exposure parameters, the light source is actuated to emit light to which the photosensitive material is exposed to produce a high gradation image of quality.

Figure 6:
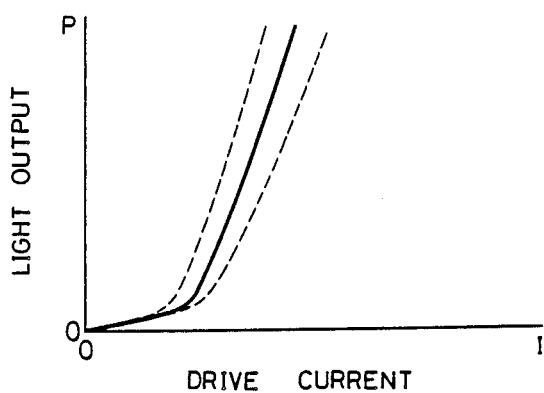
FIG. 6 is a diagram illustrating the light output (P) of a light-emitting element as a function of driving electric current (I), also showing a variation of the light output with temperature.
Figure 7:
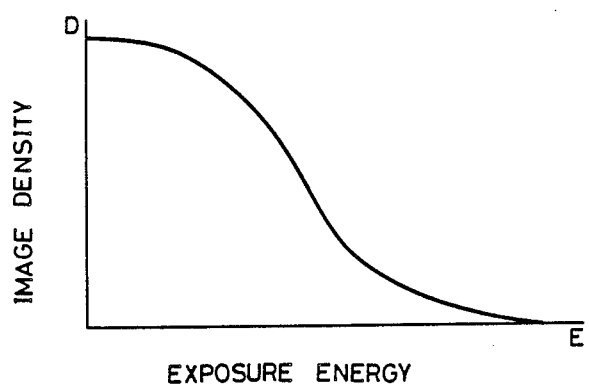
FIG. 7 is a diagram illustrating the image density (D) of a photosensitive material as a function of exposure (E)
Figure 8:
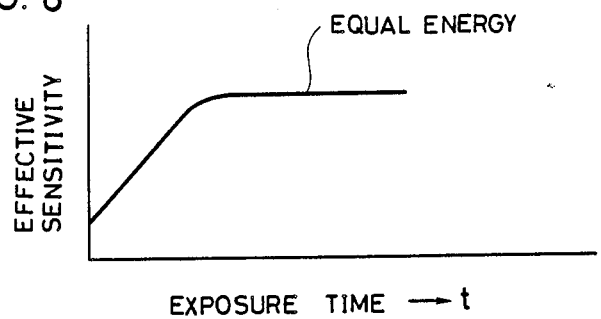
FIG. 8 is a diagram showing the effective sensitivity of a photosensitive material as a function of exposure time.

As previously described in conjunction with FIG. 6, the LD light source having such characteristic as shown in FIG. 1 generally varies its current-dependent nonlinear light output as the temperature changes.

With the fixed value of drive current to the light source corresponding to each light output modulation step, since the light output modulation step varies with a temperature change, optimum exposure parameters must be selected again accordingly. To this end, the present invention is practiced by monitoring the light output at the leading point of every page, every several lines, or every line (intended to indicate scanning page or line), re-writing the light output-to-current curve shown in FIG. 1, renewing the light output modulation steps, computing a new set of a light output modulation step and an exposure time modulation step, and eventually renewing optimum exposure parameters. The method of the present invention always allows optimum exposure parameters to be selected independent of any variation of light source output with temperature, providing for optimum exposure of the photosensitive material.

It is also contemplated to change the drive current of the light source in response to a temperature change such that each light output modulation step is always maintained constant. In this case, the photosensitive material can be always exposed under optimum exposure parameters by monitoring the light output at the leading point of every page or line, and renewing the light output-to-current curve of FIG. 1 such that a variation of the light source output may fall within a predetermined permissible error range.

The exposure method of the present invention involves monitoring the light output of a light source at the leading point of every page or line, re-writing the light output-to-current curve data once stored as a table of light output modulation steps, and computing a new set or sets of a light output modulation step and an exposure time modulation step, the set providing an exposure having an error within the permissible range. If a plurality of sets are available, one set corresponding to the maximum exposure time modulation step is selected as exposure parameters. Optimum exposure parameters are accordingly re-written. Thus the method of the present invention always allows for exposure of the photosensitive material under optimum exposure parameters without incurring reciprocity law failure or unevenness of exposure even when a variation in light output or optical nature of a light source or light-emitting element with a temperature change occurs during the image exposure process.

The exposure method of the present invention is essentially constructed as described above.

Now the exposure apparatus of the present invention is described in detail by referring to one preferred embodiment shown in the drawings.

Figure 4:
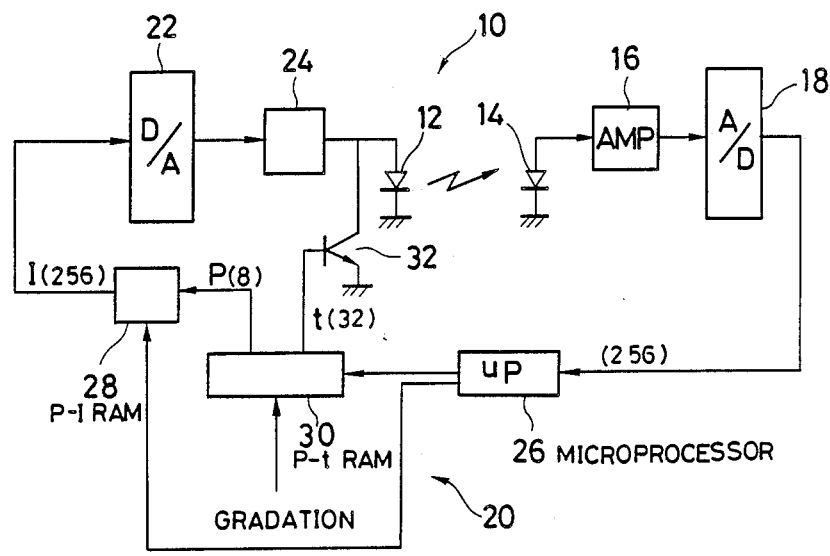
FIG. 4 is a block diagram illustrating an exposure apparatus according to one embodiment of the present invention.

FIG. 4 is a block diagram illustrating an exposure apparatus according to one preferred embodiment of the present invention. The light source used in this embodiment is a laser diode (LD) and the optical detector used is a light-receiving element in the form of a photo diode (PD).

The exposure apparatus 10 for carrying out the above-described exposure method is shown in FIG. 4 as comprising a light source in the form of an LD 12, an optical detector in the form of a PD 14, an amplifier 16, an analog/digital (A/D) converter 18, exposure parameter providing means 20 for determining as exposure parameters optimum sets of a plurality of light output modulation steps selected from the light output of the light source 12 and time modulation steps, the sets providing exposures corresponding to a plurality of image gradation levels, a digital/analog (D/A) converter 22, and a drive source 24 for driving the light source 12 in accordance with the thus determined exposure parameters.

The exposure parameter providing means 20 includes a microprocessor 26, a drive parameter table random access memory (P-I RAM) 28 for storing a light output of the light source and a drive current necessary to produce the light output, an exposure parameter table random access memory (P-t RAM) 30 for determining optimum sets of a light output modulation step and a time modulation step and storing a table of these sets, and a transistor 32 for controlling exposure time.

More specifically, the light source 12 has one terminal grounded and another terminal electrically connected to the drive source or LD driver 24 and the transistor 32. The optical detector 14 is located so as to receive a light beam emitted from the light source 12 and produces an analog signal indicative of a light output of the light source. The light detector 14 has one terminal grounded and another terminal electrically connected to the amplifier 16. The amplifier 16 amplifies the analog light output signal and has an output terminal electrically connected to an input terminal of the A/D converter 18. The A/D converter 18 thus converts the analog light output signal into a digital signal.

The light detector 14 used herein may be any optical detector which can precisely detect the light output level of the light source 12. It is typically a light-receiving semiconductor element such as a photo diode (PD) and photo transistor. The light detector 14 encompasses an electronic circuit having a light-receiving element built therein.

An output terminal of the A/D converter 18 is electrically connected to the microprocessor 26 of the exposure parameter providing means 20.

The microprocessor 26 has two output terminals, one directly connected to one input terminal of P-I RAM 28 and the other connected to P-t RAM 30. P-t RAM 30 also has two output terminals, one connected to the exposure time controlling transistor 32 and the other connected to another input terminal of P-I RAM 28. Provision is made such that P-t RAM 30 receives at its input an image signal during image scanning exposure for image recording.

An output terminal of P-I RAM 28 is electrically connected to the D/A converter 22 whose output terminal is connected to the drive source 24. The exposure parameter providing means 20 produces a digital signal indicative of a drive current value which is converted into an analog signal by the D/A converter 22. Upon receipt of the signal, the drive source 24 delivers the predetermined drive current to drive the light source 12 which produces the desired light output. At the same time, the transistor 32 controls the light source 12 to operate for only the exposure time determined by the exposure parameter providing means 20. As a consequence, the desired exposure is obtained.

The exposure parameter providing means 20 is characteristic of the present invention. It is designed as follows. Prior to image scanning exposure for image recording, with respect to all levels of exposure or exposure energy corresponding to a graded series of image densities or image gradations, optimum sets of light output modulation steps and exposure time modulation steps capable of providing said levels of exposure are computed as exposure parameters, the compouted exposure parameters are stored in P-t RAM 30, the drive current for producing the light output meeting the exposure parameters are stored in P-I RAM 28, thereby setting up the exposure parameters. Upon image scanning exposure, exposure parameters including drive current or light output and exposure time are determined in accordance with the stored parameters, the drive source 24 drives the light source 12 with the determined drive current, and the transistor 32 controls the light source 12 to operate for the determined exposure time, thus obtaining the desired exposure to produce the desired image gradation.

The exposure parameter providing means 20 sets the exposure parameters and P-I characteristic prior to the image recording of one page, several serial lines, or one line, but preferably resets and renews once or plural times part or all of the exposure parameters every page, every several serial lines, or every line at the beginning of image scanning exposure. More preferably, the means 20 resets and renews part or all of the exposure parameters prior to the image scanning exposure of every line.

The exposure apparatus 10 of the present invention determines exposure parameters by selecting optimum sets of light output modulation steps and exposure time modulation steps capable of providing the desire exposure such that an exposure error may fall within the predetermined permissible range as previously described. For example, among the eight light output modulation steps $P_0$ through $P_7$ shown in FIG. 1, two light output modulation steps $P_0$ and $P_1$ are selected in a low exposure region, all eight light output modulation steps $P_0$ through $P_7$ are selected in an intermediate exposure region, and two light output modulation steps $P_6$ and $P_7$ are selected in a high exposure region. As to the exposure time modulation steps, all 32 steps are selected in all these exposure regions. From these sets, those sets capable of achieving the desired exposure with an error falling within the permissible range are selected as shown in FIG. 2. If two or more sets are available, one set corresponding to the maximum exposure time modulation step is selected as exposure parameters. If no set is available, a set capable of affording an exposure closest to the predetermined exposure is selected as exposure parameters.

Consequently, the photosensitive material can be subjected to image exposure under optimum exposure parameters without incurring reciprocity law failure and unevenness of exposure.

Figure 9:
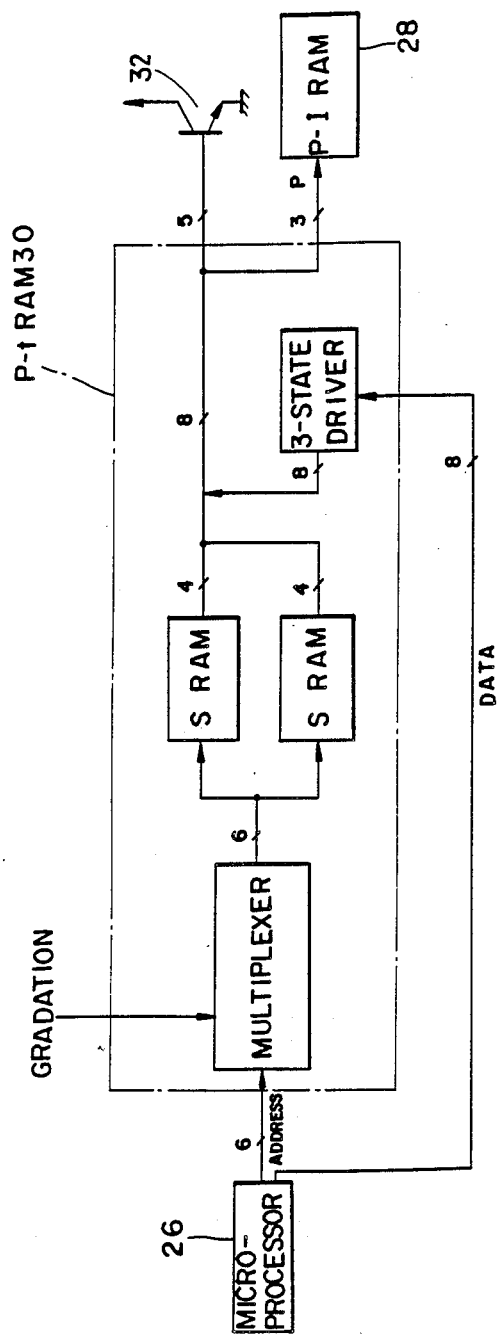
FIG. 9 is a block diagram of P-t RAM 30 used in FIG. 4.
Figure 10:
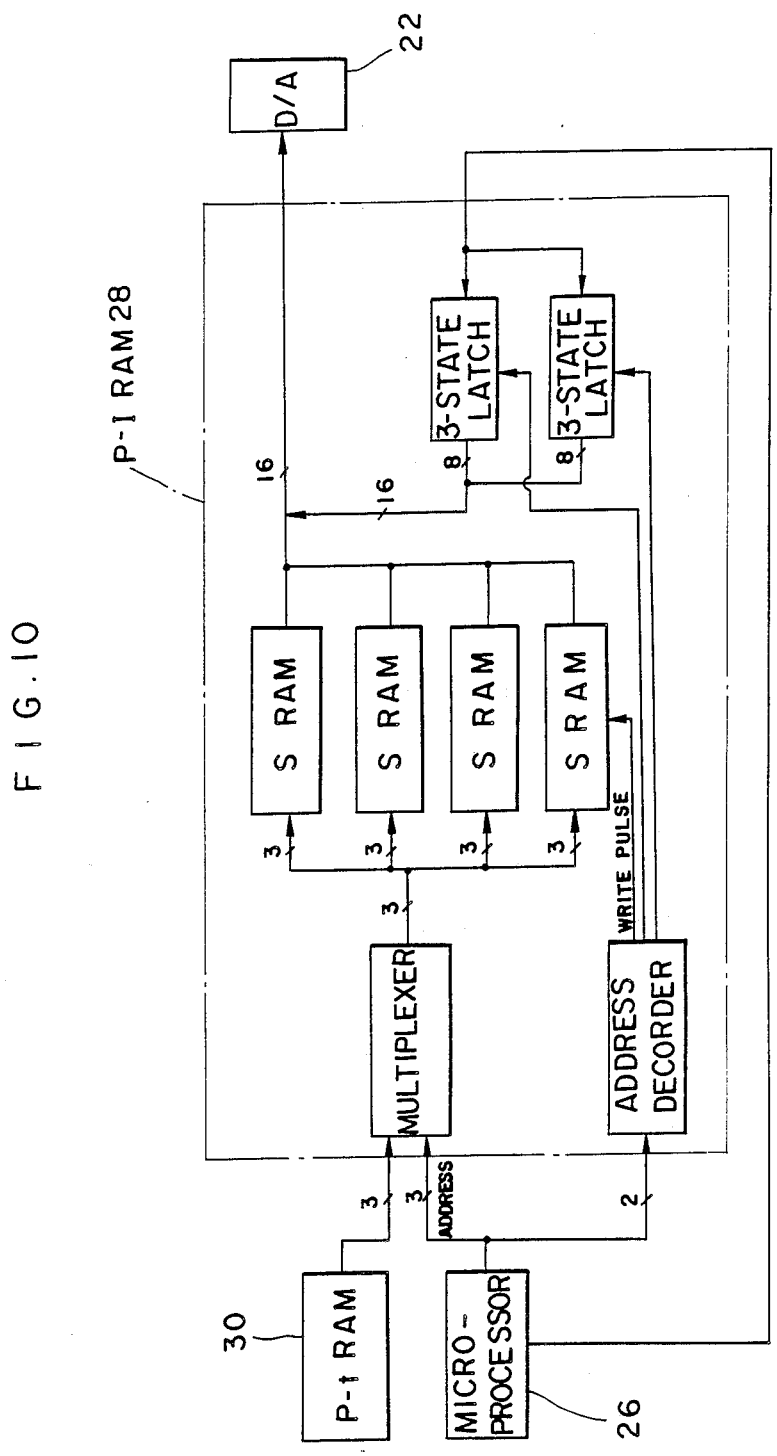
FIG. 10 is a block diagram of P-I RAM 28 used in FIG. 4.

FIGS. 9 and 10 illustrate typical arrangements of P-t RAM 30 and P-I RAM 28 used in cooperation with the microprocessor 26 in the system shown in FIG. 4. A typical example is given below by way of illustration, but not by way of limitation. The microprocessor 26 used in the example is $\mu$PD 7810, a 8-bit microcomputer of NEC of Japan. In the arrangement shown in FIG. 9, P-t RAM 30 includes a multiplexer (e.g., SN74LS157×2 of T.I.), two static RAM's ($\mu$PD 21490×2, 1K×4 CMOS SRAM of NEC), and a 3-state driver (SN74LS240 of T.I.). In the arrangement shown in FIG. 10, P-I RAM 28 includes a multiplexer (e.g., SN74LS157×1 of T.I.), an address decorder, four static RAM's ($\mu$PD 21490×2, 1K×4 CMOS SRAM of NEC), and two 3-state latches (SN74LS374×2 of T.I.). Detailed description of these arrangements is omitted because they are apparent to those skilled in the art from the figures and because they do not constitute part of the present invention.

The exposure method and apparatus of the present invention have been described with respect to their organization. Now, the operation will be described.

Figure 5:
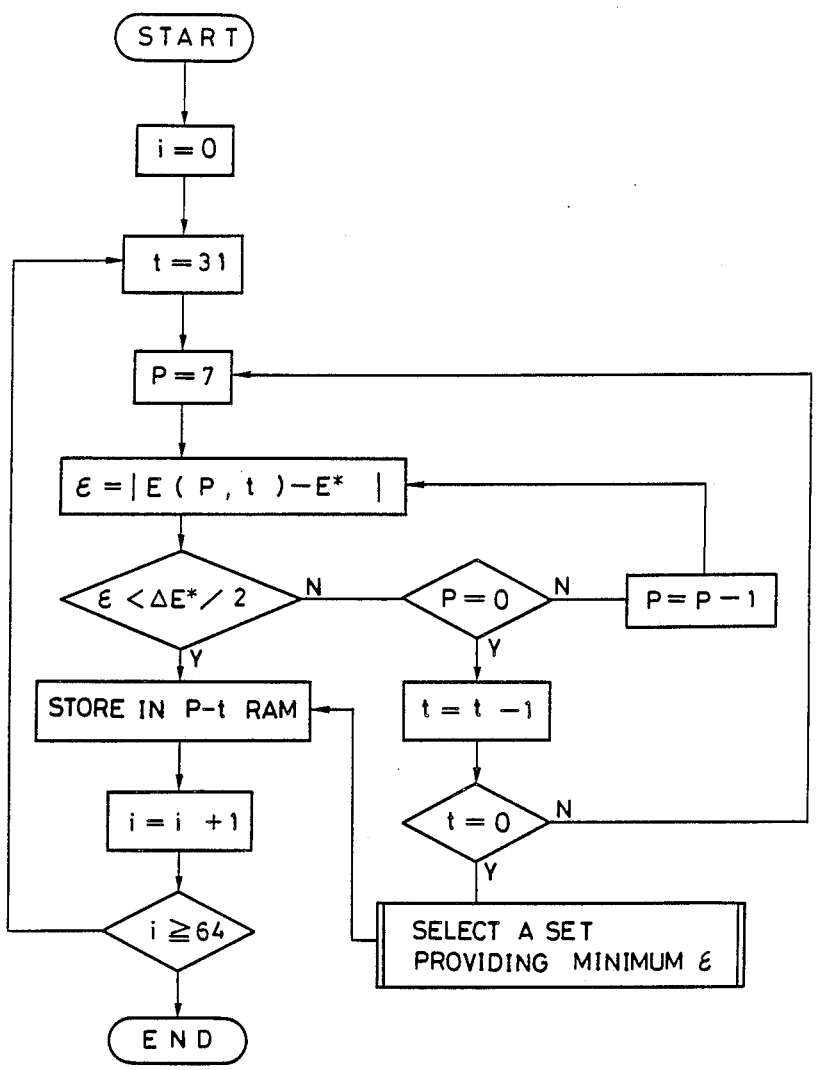
FIG. 5 is a flow chart illustrating the operation of an exposure apparatus according to one embodiment of the present invention.

FIG. 5 illustrates one exemplary procedure for the exposure parameter providing means 20 in the exposure apparatus 10 shown in FIG. 4 to determine exposure parameters by computing sets of light output modulation steps and exposure time modulation steps. Assume in this embodiment that there are selected 8 light output modulation steps $P_0$ through $P_7$ and 32 exposure time modulation steps $t_0$ through $t_{31}$.

When the exposure apparatus 10 of FIG. 4 starts image recording, the microprocessor 26 of the exposure parameter providing means 20 determines exposure parameters and stores them in P-t RAM 30 prior to image recording of a first page.

At this point, the microprocessor 26 determines exposure parameters according to the flow chart of FIG. 5.

(1) The microprocessor 26 sets the density step (exposure step i) at 0 step, 31 steps for the exposure time modulation step t, and 7 steps for the light output modulation step P.

(2) An exposure $E(P, t)$ is then calculated according to the equation: $E(P, t) = P \times t$ using a light output and a time interval corresponding to each step. An error $\epsilon$ is obtained by subtracting an exposure to be recorded $E^*$ from the calculated exposure $E(P, t)$, that is, $$\epsilon = |E(P, t) - E^*|$$

Then, the difference between the exposure to be recorded in a next step $E^*_{i+1}$ and the exposure to be recorded in the current step $E^*_i$, that is, $E^*=|E^*_{i+1}-E^*_i|$ is computed. The error $\epsilon$ is compared with the permissible error $\Delta E^*/2$. If $\epsilon$ is smaller than $\Delta E^*/2$, that is, $\epsilon < \Delta E^*/2$, then this set is stored in an exposure parameter set table or P-t RAM 30. Among many sets having an error $\epsilon$ falling within the permissible error range $\Delta E^*/2$, this set stored as exposure parameters is a set corresponding to the maximum exposure time modulation step, that is, the maximum exposure time interval, ensuring that the photosensitive material is subject to the optimum exposure without an influence of reciprocity law failure. An image of a proper density or gradation is thus formed in the photosensitive material.

(3) If error $\epsilon$ is equal to or larger than $\Delta E^*/2$, that is, $\epsilon \leq \Delta E^*/2$, it is judged whether $P=0$ or not. If P is not equal to 0, the above-mentioned procedure (2) is carried out while reducing the light output modulation step by one, that is, $P=P-1$. That is, error $\epsilon$ is calculated. The procedure is repeated by reducing P by one until error $\epsilon$ is smaller than the permissible error $\Delta E^*/2$. However, there is a case wherein $\epsilon < \Delta E^*/2$ is not achieved when P reaches 0 (P=0). Then the above-mentioned procedure (2) is carried out while reducing the exposure time modulation step by one, that is, $t=t-1$ and if this t is not equal to 0, P is again set to P=7. The procedure is repeated by reducing P by one until error $\epsilon$ is smaller than the permissible error $\Delta E^*/2$. However, there is still a case wherein $\epsilon < \Delta E^*/2$ is not achieved when P reaches 0 (P=0). Then the above-mentioned procedure (3) is repeated while reducing the exposure time modulation step t by one until error $\epsilon$ is smaller than the permissible error $E^*/2$. (4) If $\epsilon < \Delta E^*/2$ is not achieved when t reaches 0 (t=0), a set of P and t rendering the error $\epsilon$ minimum is selected as exposure parameters and stored in P-t RAM 30.

The exposure parameters of density step i are computed in this way and stored in the exposure parameter set table or P-t RAM 30.

Next, exposure parameters of a subsequent density step (i+1) are computed by repeating the above-mentioned procedure (2), and procedures (3) and (4) if necessary. In this way, exposure parameters are computed for all density steps i=0 to 63.

The microprocessor 26 delivers a table of drive current values corresponding to light output modulation steps, which is stored in P-I RAM 28. This table may be set on the basis of a light output of an actual light source prior to image recording. Alternatively, the table may be preset and renewed by monitoring an actual light output prior to image recording.

Setting or renewal of the table in P-I RAM 28 is carried out as follows.

The microprocessor 26 delivers a necessary drive current value to produce the predetermined light output to P-I RAM 28 or reads such a value out of P-I RAM 28. The signal is converted by the D/A converter 22 into an analog signal which is delivered to the drive source 24. The drive current is applied across the light source 12 to produce a light output. The light output of the light source 12 is detected by the light detector 14. The light output signal of the detector 14 is converted into a digital signal by the A/D converter 18. The microprocessor 26 compares the input signal with the predetermined light output, setting or renewing the contents of P-I table in the P-I RAM 28.

In case the light output varies, the light output modulation steps are also varied and the contents of the exposure parameter table stored in P-t RAM 30 are renewed.

Once the P-I table in P-I RAM 28 and the exposure parameter table in P-t RAM 30 are set in this way, optimum exposure parameters for an image gradation or density step read from an original document are read out of P-t RAM 30. The light output modulation step of the read-out exposure parameters is delivered to P-I RAM 28 which reads out a drive current value, which is converted into an analog signal by the D/A converter 22. The analog drive current value applied by the drive source 24 and the exposure time modulation step of the transistor 32 control the light source 12 to operate at the selected light output for the selected exposure time.

As previously described, the light output modulation steps are not limited to 8 steps, and the exposure time modulation steps are not limited to 32 steps. The number of these steps may be determined according to the exposure required for an image. The time of setting and renewal of the P-I table in P-I RAM 28 and the exposure parameter table in P-t RAM 30 is not limited to the beginning of each page, and such setting and renewal may be carried out at the beginning of every several serial lines or every line. Further, setting and renewal may be partial or entire.

While preferred embodiments have been described, obviously many modifications and variations of the present invention are possible in the light of the above teachings. It is therefore to be understood that within the scope of the appended claims, the invention may be practiced otherwise than as specifically described.

According to the method of the invention for exposing a photosensitive material to light from a light source in the form of a light-emitting element such as LD and LED, prior to image recording of one page, a stable light output region of the light source is divided into a plurality of light output modulation steps, a plurality of exposure time modulation steps are separately selected, sets of a light output modulation step and an exposure time modulation step are computed which can provide the exposure required to provide each of a graded series of image densities or gradations, a set corresponding to the maximum exposure time modulation step is selected from the compouted sets as exposure parameters, the exposure parameters are partially or entirely renewed every page, every several serial lines, every line or arbitrarily, and thereafter the photosensitive material is exposed in accordance with the selected exposure parameters. Even when a photosensitive material having a nonlinear characteristic is exposed with a light-emitting element having a nonlinear input-to-output characteristic, the present method has advantages that stable exposure control is enabled in a low exposure region, control in an intermediate density region is carried out with a relatively simple circuit, and a lowering of sensivity by reciprocity law failure is minimized.

The exposure apparatus of the present invention enables to always expose a photosensitive material to light from a light source in an proper exposure amount because the light detector moniters the light output of the light source, the exposure parameter providing means computes exposure parameters or driving parameters for the light source at the beginning of each page and renews part or all of the data every page, every several lines or every line or arbitrarily, and the drive means operates the light source in accordance with the selected exposure parameters. The present apparatus has advantages that stable exposure control is enabled in a low exposure region, control in an intermediate density region is carried out with a relatively simple circuit, and a lowering of sensivity by reciprocity law failure is minimized.

I claim:

1. A method for exposing a photosensitive material to light from a light source in a desired total exposure corresponding to the image density of each picture element, comprising the steps of:

determining the total exposure as sets of exposure parameters, each set comprising one of a plurality of light output modulation steps selected from the light output of the light source under predetermined conditions and one of a plurality of exposure time modulation steps, selecting a set corresponding to the maximum exposure time modulation step among said sets as exposure parameters, and exposing the photosensitive material in accordance with said exposure parameters to achieve the desired total exposure.

2. The method of claim 1 wherein said exposing step comprises scanning said material for a plurality of scans and providing continuous light from said light source for a duration equal to the duration of each said scan.

3. An apparatus for exposing for image recording a photo-sensitive material to light in a desired total exposure corresponding to the image density of each picture element, comprising:

a light source for producing a single light emission output, for a variable duration, an optical detector for detecting the light output of the light source, exposure parameter providing means for, prior to exposure of the photosensitive material to continuous light from the light source, determining the desired total exposure as sets of exposure parameters, each set comprising one of a plurality of light output modulation steps selected from the detected light output under predetermined conditions and one of a plurality of exposure time modulation steps, and selecting a set corresponding to the maximum exposure time modulation step among said sets as exposure parameters, and means for actuating said light source in accordance with the set of selected exposure parameters to achieve a desired total exposure.

4. A method for exposing a photosensitive material to light from a light source in an exposure corresponding to the desired image density of each picture element, where the light source value and the exposure time value for a plurality of exposure conditions are stored as a plurality of first sets and the stored light output value and light source current data also are stored as a plurality of second sets, comprising the steps of:

providing light from said light source at a leading point prior to exposure;

monitoring the light output of said light source at said leading point;

rewriting the values in said second set on the basis of light output detected by said monitoring step;

computing at least one new light output value and time exposure value in said first set and storing said values;

selecting from among said pairs of values in said first set a pair providing a optimum exposure having an error within a range; and exposing the photosensitive material in accordance with said exposure parameters.

5. The method of claim 4, wherein said first set comprises a plurality of pairs of values which provide an optimum exposure setting, and said selecting step further comprising selection of the pair of values having the maximum exposure time value.

6. The method of claim 5, wherein the rewriting of the first data set is on the basis of feedback control using said light output and comparing it to a predetermined value.

7. The method of claim 4 wherein said exposing step comprises scanning said material for a plurality of scans and providing continuous light from said light source for a duration equal to the duration of each said scan.

8. An image recording apparatus for exposing a photosensitive material to light in an exposure corresponding to the image density of each picture element comprising:

a light source responsive to a control signal for producing a variable light output;

an optical detector for detecting light output of said light source and producing detected output information, and exposure parameter providing means, said means comprising:

means for determining a plurality of sets of optimum exposure parameters, each set comprising a light output value and a time exposure value, in response to said detected output information, a first storage means for storing said plurality of sets of optimum exposure parameters and for outputting one of said sets in response to said selecting means;

second storage means for storing output control signal information and providing said information as said output control signal in response to said light output value information;

means for selecting one of a plurality of sets of optimum exposure parameters in said first storage means; and means for actuating said light source in accordance with the selected exposure parameters.

9. The apparatus of claim 8, wherein said means for selecting identifies at least one set of optimum exposure parameters such that exposure error falls within a predetermined range.

10. The apparatus of claim 6, wherein one of a plurality of sets of optimum exposure parameters is selected on the basis of maximum exposure time.

11. The image recording apparatus of claim 8, wherein said apparatus is operative to expose at least one page, comprising plural lines, and said means for determining comprises means for resetting at least part of said exposure parameters stored in said first storage means prior to the exposure of at least part of a page in response to said detected output information.

12. The apparatus of claim 11, wherein said means for resetting parameters operates at the beginning of each scan line on a page.

13. The apparatus of claim 8, wherein said apparatus is operative to provide a plurality of exposure values and said means for determining is initialized at a first density value and first sets of exposure parameters are determined on the basis of a maximum time of exposure and, additional sets of said exposure parameters are calculated for a plurality of second density values.

14. The apparatus of claim 8, further comprising means for renewing said second storage means parameter values on the basis of a comparison of a predetermined detected output with an actual detected output produced on the basis of predetermined parameter input values.

15. The apparatus of claim 8 further comprising means for scanning said light source with plural scans for exposure of said material.

16. The apparatus of claim 14 wherein said means for scanning and said means for actuating are operative to provide continuous light to said material for the duration of an entire scan.

* * * * *